(12) United States Patent
Church et al.

(10) Patent No.: US 11,367,617 B2
(45) Date of Patent: Jun. 21, 2022

(54) GRADED HARDMASK INTERLAYER FOR ENHANCED EXTREME ULTRAVIOLET PERFORMANCE

(71) Applicant: INTERNATIONAL BUSINESS MACHINES CORPORATION, Armonk, NY (US)

(72) Inventors: Jennifer Church, Troy, NY (US); Ekmini A. De Silva, Slingerlands, NY (US); Dario Goldfarb, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/197,406

(22) Filed: Mar. 10, 2021

(65) Prior Publication Data

US 2021/0202249 A1 Jul. 1, 2021

Related U.S. Application Data

(63) Continuation of application No. 16/188,843, filed on Nov. 13, 2018, now Pat. No. 10,998,191.

(51) Int. Cl.
   *H01L 21/033* (2006.01)
   *G03F 7/20* (2006.01)
   *H01L 21/027* (2006.01)

(52) U.S. Cl.
   CPC ...... *H01L 21/0337* (2013.01); *G03F 7/70033* (2013.01); *H01L 21/0274* (2013.01); *H01L 21/0332* (2013.01)

(58) Field of Classification Search
   None
   See application file for complete search history.

(56) References Cited

U.S. PATENT DOCUMENTS

| | | |
|---|---|---|
| 8,257,910 B1 | 9/2012 | Guerrero et al. |
| 8,968,989 B2 | 3/2015 | Ouattara et al. |
| 9,929,012 B1 | 3/2018 | Belyansky et al. |
| 2002/0012876 A1* | 1/2002 | Angelopoulos ... H01L 21/02126 430/271.1 |

(Continued)

OTHER PUBLICATIONS

De Silva, "Single-Expose Patterning Development for EUV Lithography", Proceedings of SPIE, vol. 10143, Mar. 2017, 10 pages.

(Continued)

*Primary Examiner* — Allan W. Olsen
(74) *Attorney, Agent, or Firm* — Tutunjian & Bitetto, P.C.; Abdy Raissinia

(57) ABSTRACT

A patterning stack and methods are provided for semiconductor processing. The method includes forming a graded hardmask, the graded hardmask including a first material and a second material with extreme ultraviolet (EUV) absorption cross sections for absorption of EUV wavelengths, the second material configured to provide adhesion to photoresist materials. The method also includes depositing a photoresist layer over the graded hardmask. The method additionally includes patterning the photoresist layer. The method further includes etching the graded hardmask. The method also includes removing the photoresist layer.

20 Claims, 9 Drawing Sheets

(56) References Cited

U.S. PATENT DOCUMENTS

| | | | |
|---|---|---|---|
| 2010/0181682 A1* | 7/2010 | Arai | H01L 23/5329 |
| | | | 257/774 |
| 2012/0328990 A1 | 12/2012 | Yao et al. | |
| 2013/0164691 A1* | 6/2013 | Shiobara | G03F 7/0046 |
| | | | 430/325 |
| 2013/0221491 A1* | 8/2013 | Wann | H01L 29/7856 |
| | | | 257/618 |
| 2013/0306596 A1* | 11/2013 | Fukaya | G03F 1/54 |
| | | | 216/51 |
| 2014/0268082 A1 | 9/2014 | Michaelson et al. | |
| 2015/0241781 A1* | 8/2015 | Carcasi | G03F 7/40 |
| | | | 216/49 |
| 2015/0241793 A1* | 8/2015 | Carcasi | G03F 7/70608 |
| | | | 430/30 |
| 2016/0251546 A1 | 9/2016 | Nakajima et al. | |
| 2017/0092495 A1 | 3/2017 | Chen et al. | |
| 2017/0146909 A1 | 5/2017 | Smith et al. | |
| 2019/0094698 A1* | 3/2019 | Carcasi | G03F 7/091 |
| 2019/0212656 A1* | 7/2019 | Dai | C23C 14/0036 |
| 2019/0267229 A1* | 8/2019 | Isogai | H01L 21/0217 |

OTHER PUBLICATIONS

Goldfarb, "Fundamentals of EUV Resist-Inorganic Hardmask Interactions", SPIE Advanced Lithography, vol. 10146, Mar. 2017, 13 Pages.

Grenville, "Integrated Fab Process for Metal Oxide EUV Photoresist", SPIE Advanced Lithography, Feb. 2015, 8 pages.

Masson, "Cobalt-Containing Polymers as Patterning Assist Layers in Extreme Ultra-Violet Lithography", Proceedings of SPIE, vol. 7636, Mar. 2010, 10 pages.

Sakamoto, "Development of Under Layer Material for EUV Lithography", SPIE Advanced Lithography, vol. 7969, Apr. 2011, 8 pages.

List of IBM Patents or Patent Applications Treated as Related dated Mar. 10, 2021, 2 pages.

* cited by examiner

10

1300

Form a graded hardmask, the graded hardmask including a first material and a second material with extreme ultraviolet (EUV) absorption cross sections for absorption of EUV wavelengths, the second material configured to provide adhesion to photoresist materials.
1310

The graded hardmask includes the first material and gradients of the second material doped into the first material.
1311

The graded hardmask includes vertical grading of the first material and the second material.
1315

Adjust a percentage of the first material to the second material linearly across a thickness.
1316

The second material is selected from the group consisting of high-Z metals, metalloids, and halogens.
1317

The second material has a EUV absorptivity cross-section at 92 eV.
1318

Deposit a photoresist layer over the graded hardmask.
1320

Pattern the photoresist layer.
1330

Etch the graded hardmask.
1340

Remove the photoresist layer.
1350

Grade a hardmask, including a first material and a second material with high extreme ultraviolet (EUV) absorption cross sections for absorption of EUV wavelengths, by adjusting a percentage of the second material in the hardmask to include a highest percentage of the second material at a top surface of the hardmask.
1410

The hardmask includes vertical grading of the first material and the second material.
1415

The second material is selected from the group consisting of high-Z metals, metalloids, and halogens.
1416

The second material has a EUV absorptivity cross-section of at least 92 eV.
1417

Deposit a photoresist layer over the top surface of the hardmask.
1420

Pattern the photoresist layer with a dosage extreme ultraviolet source to reduce scumming defectivity.
1430

Remove portions of the photoresist layer with a developer.
1432

Etch the hardmask.
1440

Remove the photoresist layer.
1450

FIG. 14

```
                                    1500
┌─────────────────────────────────────────────────────────────────┐
│ Grade a hardmask, including a first material and a second      │
│ materail with high extreme ultraviolet (EUV) absorption cross   │
│ sections, by adjusting a concentration of the second material   │
│ in the hardmask by doping the first material with the second    │
│ material.                                                       │
│                              1510                               │
│   ┌─────────────────────────────────────────────────────────┐   │
│   │   The hardmask includes spinning-on the first material. │   │
│   │                          1515                           │   │
│   └─────────────────────────────────────────────────────────┘   │
│   ┌─────────────────────────────────────────────────────────┐   │
│   │  The second material is selected from the group         │   │
│   │  consisting of high-Z metals, metalloids, and halogens. │   │
│   │                          1516                           │   │
│   └─────────────────────────────────────────────────────────┘   │
│   ┌─────────────────────────────────────────────────────────┐   │
│   │  The second material has a EUV absorptivity             │   │
│   │  cross-section of at least 92 eV.                       │   │
│   │                          1517                           │   │
│   └─────────────────────────────────────────────────────────┘   │
└─────────────────────────────────────────────────────────────────┘
```

Deposit a photoresist layer over the hardmask.
1520

Pattern the photoresist layer with a dosage extreme ultraviolet source to reduce scumming defectivity.
1530

Utilize a EUV dosage from about 25mJ-100mJ.
1532

Etch the hardmask.
1540

Remove the photoresist layer.
1550

GRADED HARDMASK INTERLAYER FOR ENHANCED EXTREME ULTRAVIOLET PERFORMANCE

BACKGROUND

Technical Field

The present invention generally relates to semiconductor processing, and more particularly to a graded hardmask interlayer for enhancing extreme ultraviolet performance.

Description of the Related Art

Semiconductor patterning often employs masks for processing semiconductor structures. In some instances, multiple masking layers are employed to process different areas of a chip or wafer using different portions of the multilayered structure. In one example, patterning schemes can be employed utilizing a resist layer and photolithography to protect portions of the chip, etc. The resist thickness and/or exposure time along with development can cause resist scumming, which occurs when the resist is not sufficiently cleared.

SUMMARY

In accordance with an embodiment of the present invention, a method for semiconductor processing is provided. The method includes forming a graded hardmask, the graded hardmask including a first material and a second material with extreme ultraviolet (EUV) absorption cross sections for absorption of EUV wavelengths, the second material configured to provide adhesion to photoresist materials. The method also includes depositing a photoresist layer over the graded hardmask. The method additionally includes patterning the photoresist layer. The method further includes etching the graded hardmask. The method also includes removing the photoresist layer.

In accordance with another embodiment of the present invention, a method for semiconductor processing is provided. The method includes grading a hardmask, including a first material and a second material with high extreme ultraviolet (EUV) absorption cross sections for absorption of EUV wavelengths, by adjusting a percentage of the second material in the hardmask to include a highest percentage of the second material at a top surface of the hardmask. The method also includes depositing a photoresist layer over the hardmask. The method additionally includes patterning the photoresist layer with a dosage extreme ultraviolet source to reduce scumming defectivity. The method further includes etching the hardmask. The method also includes removing the photoresist layer.

In accordance with yet another embodiment of the present invention, a method for semiconductor processing is provided. The method includes grading a hardmask, including a first material and a second material with high extreme ultraviolet (EUV) absorption cross sections for absorption of EUV wavelengths, by adjusting a concentration of the second material in the hardmask by doping the first material with the second material. The method also includes depositing a photoresist layer over the hardmask. The method additionally includes patterning the photoresist layer with a dosage extreme ultraviolet source to reduce scumming defectivity. The method further includes etching the hardmask. The method also includes removing the photoresist layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 13 is a block/flow diagram showing a method for forming a semiconductor device in accordance with embodiments of the present invention;

FIG. 14 is a block/flow diagram showing a method for forming a semiconductor device in accordance with embodiments of the present invention; and FIG. 15 is a block/flow diagram showing a method for forming a semiconductor device in accordance with embodiments of the present invention.

DETAILED DESCRIPTION

Figure 1:
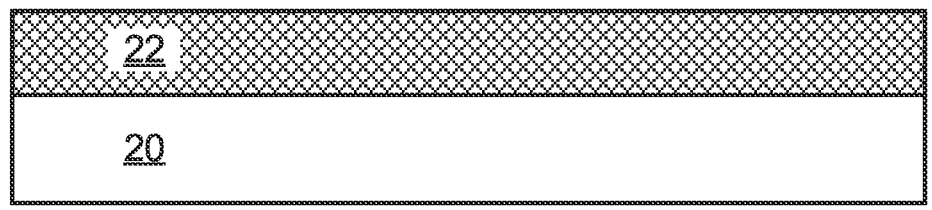
FIG. 1 is a cross-sectional view illustratively showing a semiconductor device including a graded hardmask formed thereon, in accordance with an embodiment of the present invention.

In accordance with aspects of the present invention, protective structures and processing methods are provided for processing semiconductor devices. In particularly useful embodiments, the processing methods can be employed in complementary metal oxide semiconductor (CMOS) device processing, especially where different areas of the CMOS device need to be protected during the CMOS forming process.

The semiconductor device can include a substrate. The substrate can include any structures formed therein. In one embodiment, the substrate can include an organic layer. The organic layer can include a single layer of organic material. The organic layer can also include a composite organic layer including a stack of organic and inorganic layers.

The semiconductor device can include a graded hardmask and a photoresist layer. Once the photoresist layer is applied to the semiconductor device, extreme ultraviolet (EUV) light lithography can be performed to pattern the photoresist layer. EUV lithography improves the precision of lithography and enables scaling of an etch mask due to a small wavelength. However, EUV is difficult to implement because it can result in scumming or high line edge roughness (LER) of patterned features in the mask, which reduces the lithographic process window by inducing defects that are transferred post hardmask open and thus reduces yield of the resulting device.

The graded hardmask can include a gradient of embedded high-Z materials, with enhanced EUV absorption cross-sections. High-Z materials are materials with a high atomic number (Z) of protons in the nucleus. High-z materials can include elements with an atomic number greater than, e.g., 47. The graded hardmask improves secondary electron generation and electron yield at the interface of a photoresist layer and the graded hardmask, thus improving the scumming defectivity of the patterned features. The graded design allows tunable adhesion at both interfaces: between the graded hardmask and the substrate and between the graded hardmask and the photoresist layer, eliminating the need for an adhesion promoter.

In one embodiment, the graded hardmask can include a combination of vacuum co-deposited materials and can be vertically graded. Top materials can include a higher concentration of high EUV absorption cross sections, such as high-Z metals, metalloids and halogens, including but not limited to Sn, Sb, Te Cd, Cs, and I and derivatives thereof, with proven EUV absorptivity cross-section of at least 92 eV. Bottom materials can act as seed layers to optimize the top layer closure and avoid a rough top surface or prevent intermixing or delamination with the substrate. The selection of the top materials and the bottom materials permits tunable adhesion at both the substrate interface and the photoresist layer interface. In one example, the graded hardmask includes tin (Sn). The Sn based graded hardmask includes the Sn gradient increasing from bottom to top. At the bottom the Sn is deposited as tin oxide (SnO) or tin nitride (SnN) for good adhesion to the substrate with the concentration of Sn increasing to have high Sn composition on the top surface directly under the photoresist layer.

In another embodiment, the graded hardmask can be a spin-on or deposited material and can include a gradient of material(s) that have high EUV absorption cross sections, such as high-Z metals, metalloids and halogens, including but not limited to Sn, Sb, Te Cd, Cs and I and derivatives thereof, with proven EUV absorptivity cross-section of at least 92 eV. The selection of the material permits tunable adhesion at both the substrate interface and the photoresist layer interface. In one example, the graded hardmask includes silicon. The silicon based graded hardmask includes iodine doping where the iodine concentration is increased from bottom to top so to have max iodine doping at the top.

Eliminating the need for an adhesion promoter can reduce scumming, limit interfacial resist poisoning, and enable optimal interaction between the photoresist layer and the graded hardmask.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. it will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, an illustration of a cross-sectional view showing a semiconductor device 10 including a graded hardmask 22 formed thereon according to an embodiment of the present invention is illustratively shown.

According to aspects of the present invention, a semiconductor device 10 can include a graded hardmask 22 formed thereon. The semiconductor device 10 can include a bulk substrate 20. The bulk substrate 20 can be a single substrate formed of a suitable semiconducting material, such as, e.g., silicon (Si), silicon germanium (SiGe), silicon carbide (SiC), gallium arsenide (GaAs), or any other suitable semiconducting group II, III, IV, V or VI material and combinations thereof.

However, the bulk substrate 20 can also include multiple layers. For example, the bulk substrate 20 can include suitable semiconducting material, such as Si, SiGe, GaAs, InAs and other like semiconductors. Layered semiconductors such as Si/Ge and Semiconductor-On-Insulators (SOI) are also contemplated herein. Si-containing materials include, but are not limited to: Si, single crystal Si, polycrystalline Si, SiGe, amorphous Si, silicon-on-insulator substrates (SOI), SiGe-on-insulator (SGOI), annealed poly Si, and poly Si line structures. The Si-containing material can be the substrate of the device, or a Si-containing layer formed atop the substrate, e.g., a polySi gate or a raised source/drain region. The bulk substrate 20 can include any structures formed therein.

In one embodiment, the bulk substrate 20 can include an organic layer. The organic layer can include a single layer or multiple layers of organic material. The organic layer can also include a composite organic layer including a stack of organic and inorganic layers.

The graded hardmask 22 can include a gradient of embedded high-Z materials, with enhanced EUV absorption cross-sections. The graded hardmask 22 improves secondary electron generation and electron yield at the interface of a photoresist layer 24 and the graded hardmask 22, increasing development of the photoresist layer 24. The graded design allows tunable adhesion at both interfaces: between the graded hardmask 22 and the bulk substrate 20 and between the graded hardmask 22 and the photoresist layer 24, eliminating the need for an adhesion promoter.

Figure 2:
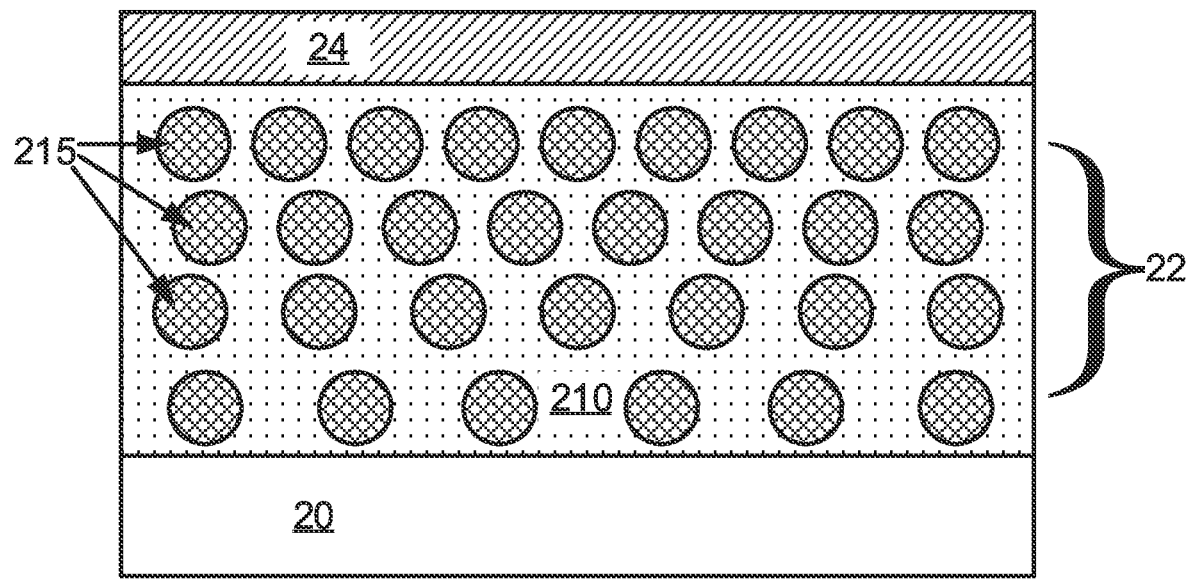
FIG. 2 is a cross-sectional view showing a photoresist layer on a graded hardmask layer on the semiconductor device, in accordance with an embodiment of the present invention.

In another embodiment, the graded hardmask 22 can include a hardmask matrix 210, as shown in FIG. 2. The hardmask matrix 210 can be a spin-on or deposited material and can include a gradient of material(s) 215 that have high EUV absorption cross sections, such as high-Z metals, metalloids and halogens, including but not limited to Sn, Sb, Te Cd, Cs and I and derivatives thereof, with proven EUV absorptivity cross-section of at least 92 eV. The selection of the material permits tunable adhesion at both the bulk substrate 20 interface and the photoresist layer 24 interface. The tunable adhesion can be accomplished by selecting a base material with good adhesion characteristics to the bulk substrate 20 and the gradient of materials 215 with good adhesion characteristics to the photoresist layer 24. In one embodiment, the graded hardmask matrix 210 includes silicon. The silicon based graded hardmask matrix 210 includes iodine doping where the iodine concentration is increased from bottom to top so to have maximum iodine doping at the top.

Figure 3:
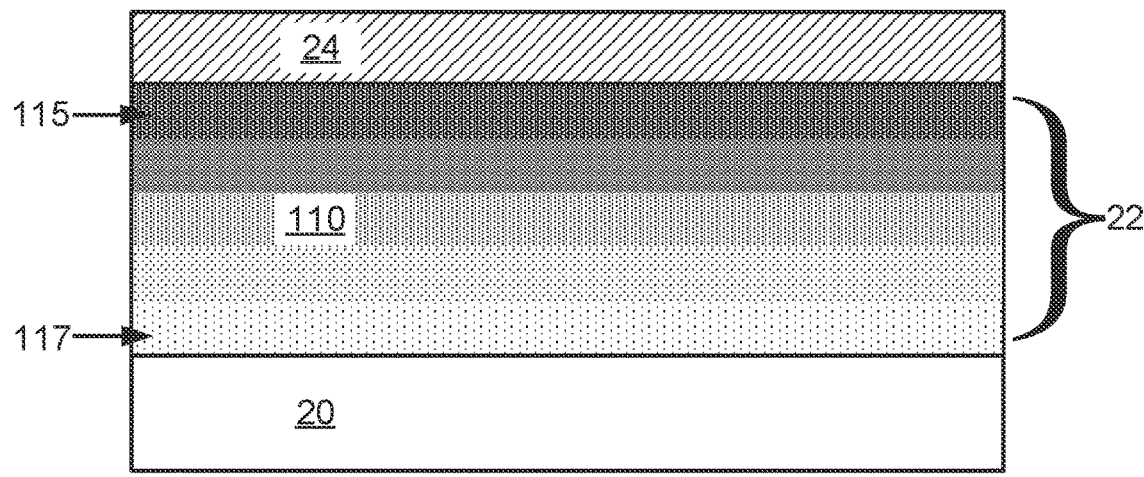
FIG. 3 is a cross-sectional view showing a photoresist layer on a graded hardmask layer on the semiconductor device, in accordance with an embodiment of the present invention.

In one embodiment, the graded hardmask 22 can include a hardmask matrix 110, as shown in FIG. 3. The hardmask matrix 110 can include on a combination of vacuum co-deposited materials and will be vertically graded. Top materials 115 can include high EUV absorption cross sections, such as high-Z metals, metalloids and halogens, including but not limited to Sn, Sb, Te Cd, Cs, and I and derivatives thereof, with proven EUV absorptivity cross-section of at least 92 eV. Bottom materials 117 can act as seed layers to optimize the top layer closure and avoid a rough top surface or prevent intermixing or delamination with the bulk substrate 20. The selection of the top materials 115 and the bottom materials 117 permits tunable adhesion at both the bulk substrate 20 interface and the photoresist layer 24 interface. In one embodiment, the graded hardmask matrix 110 includes tin (Sn). The Sn based graded hardmask matrix 110 includes the Sn gradient increasing from bottom to top. At the bottom the Sn is deposited as tin oxide (SnO) or tin nitride (SnN) for good adhesion to the bulk substrate 20 with the concentration of Sn increasing to have high Sn composition on the top surface directly under the photoresist layer 24.

Figure 4:
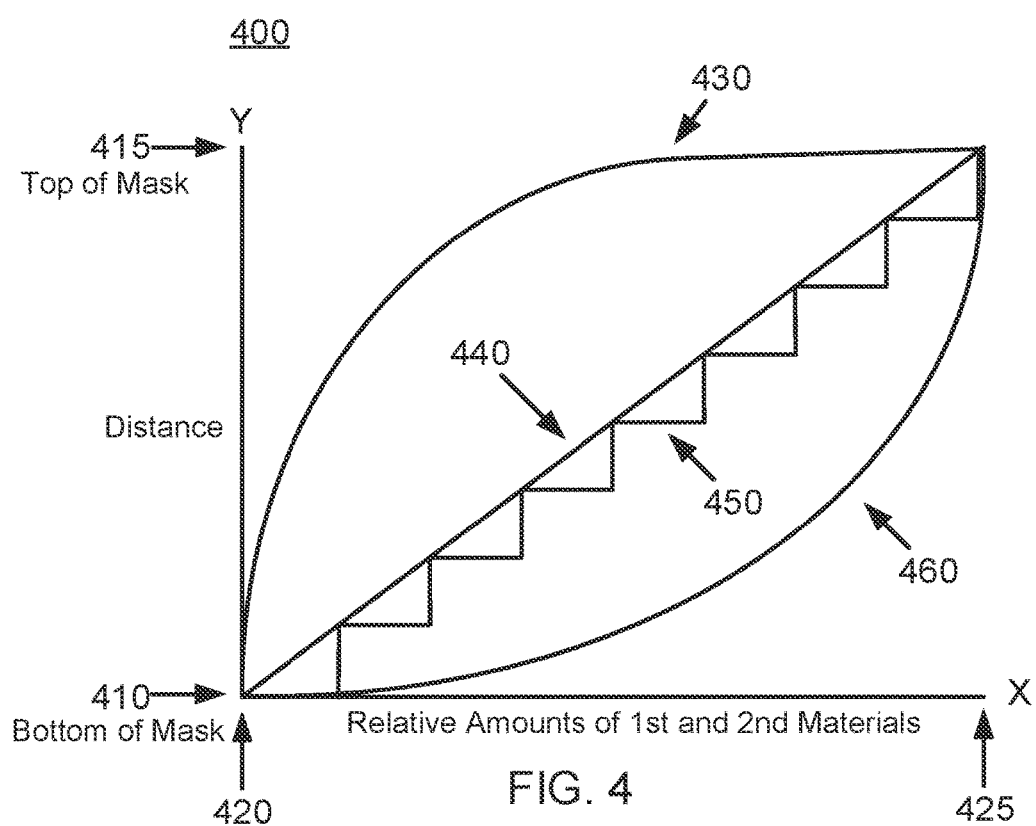
FIG. 4 is a graph view showing gradient curves of graded hardmask layers on the semiconductor device, in accordance with an embodiment of the present invention.

The percentage of gradient of material(s) 215 from FIG. 2 and the concentration of graded materials from FIG. 3 can vary. FIG. 4 shows a graph of gradient curves of graded hardmask layers. The curves shown are an illustrative example and not limiting of the invention. The y-axis of the graph represents the graded hardmask layer 22, with 410 being the surface of the graded hardmask layer 22 nearest to the bulk substrate 20 and 415 being the surface of the graded hardmask layer 22 nearest the photoresist layer 24. The x-axis of the graph is the percentage or concentration of a first material compared to a second material with 420 being more of the first material and 425 being more of the second material. This would represent the base material compared to the gradient of material(s) 215 from FIG. 2 and the top materials 115 compared to the bottom materials 117 in FIG. 3. The percentage or concentration of materials can follow a plurality of curves or steps. In one embodiment, the percentage or concentration can follow a linear curve 440. In another embodiment, the percentage or concentration can follow a step 450. In other embodiments, the percentage or concentration can follow curves similar to 430 and 460 or geometric curves or logarithmic curves or any curve that adjust the percentage or concentration.

Figure 5:
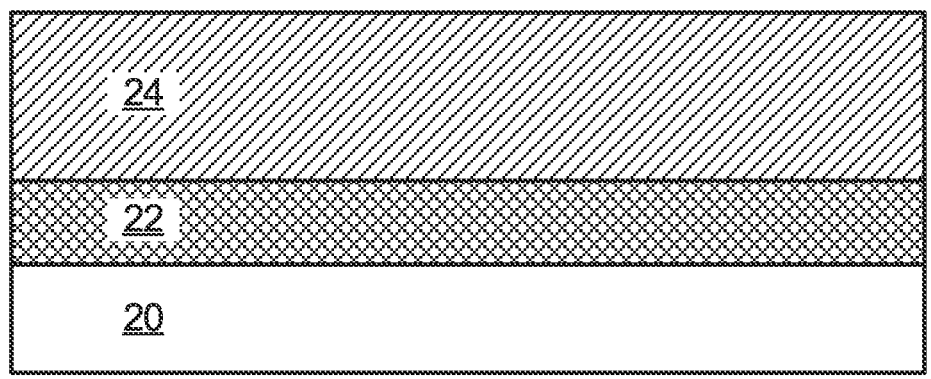
FIG. 5 is a cross-sectional view of the device of FIG. 1 showing a photoresist layer formed on the semiconductor device, in accordance with an embodiment of the present invention.

Referring to FIG. 5, the photoresist layer 24 is formed on the semiconductor device 10. The photoresist layer 24 is a light or radiation sensitive material and exposure to light causes changes in the photoresist structure. For example, exposure to light may change the exposed portions of the photoresist layer 24 from a soluble condition to an insoluble one. In one or more embodiments, the photoresist layer 24 can be formed on the graded hardmask 22, where the photoresist layer 24 can be a photoresist that can be sensitive EUV light, for example, an organic photoresist (e.g., poly(methyl methacrylate) (PMMA)), a photo-sensitive chemically amplified resist (e.g., poly(tert-butoxycarboxystyrene) (PBOCSt)), or an inorganic non-CAR negative tone resist (e.g., spin-coating solvent and organic ligand-refractory metal oxide nanoparticle). The photoresist layer 24 can be formed by low-pressure chemical vapor deposition (LPCVD) or spun-on. In various embodiments, the photoresist layer 24 can include photo acid generators (PAGs) to increase sensitivity to the EUV light. The photoresist layer 24 can be a negative resist or a positive resist. The photoresist layer 24 is selectively etchable to the graded hardmask 22. Selectively etchable to means that a particular etchant which attacks one of the materials will not attack the other material as quickly, allowing for controlled removal of each material. The photoresist layer 24 can include a thickness ranging from about 5 nm to about 500 nm.

A positive resist refers to a photoresist that becomes more soluble in an alkaline developer when exposed to radiation. The positive resist does not crosslink when it is exposed, developed, or when optionally baked before or after development. By contrast, a negative resist refers to a photoresist that becomes less soluble in an alkaline developer when exposed to radiation, due to a photo-induced crosslinking mechanism.

Figure 6:
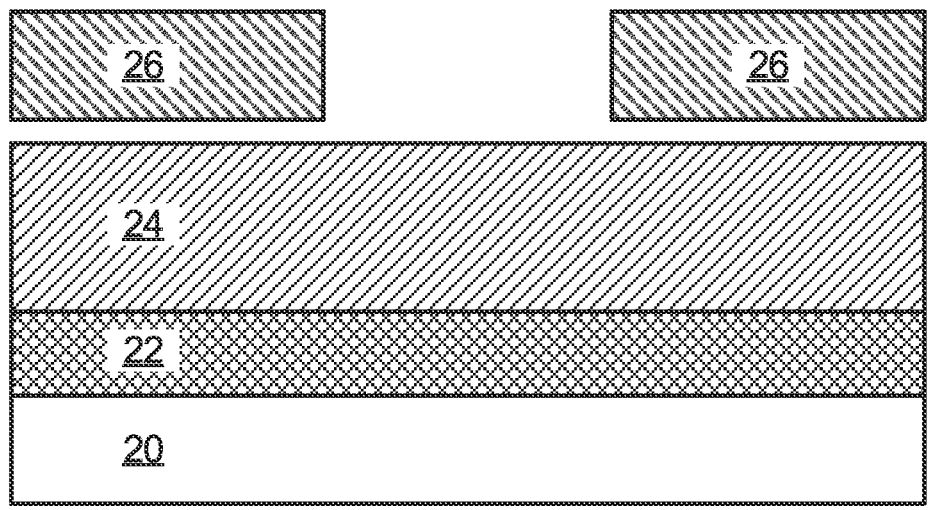
FIG. 6 is a cross-sectional view of the device of FIG. 5 showing a lithographic mask formed on the semiconductor device, in accordance with an embodiment of the present invention.

Referring to FIG. 6, a lithograph mask 26 is formed or placed on the device 10. The lithograph mask 26 includes the pattern to be transferred onto the photoresist layer 24 on the surface to be etched, or alternatively implanted. Light is passed through the opaque pattern of the lithograph mask 26, which in turn produces a patterned image on the photoresist layer 24.

Figure 7:
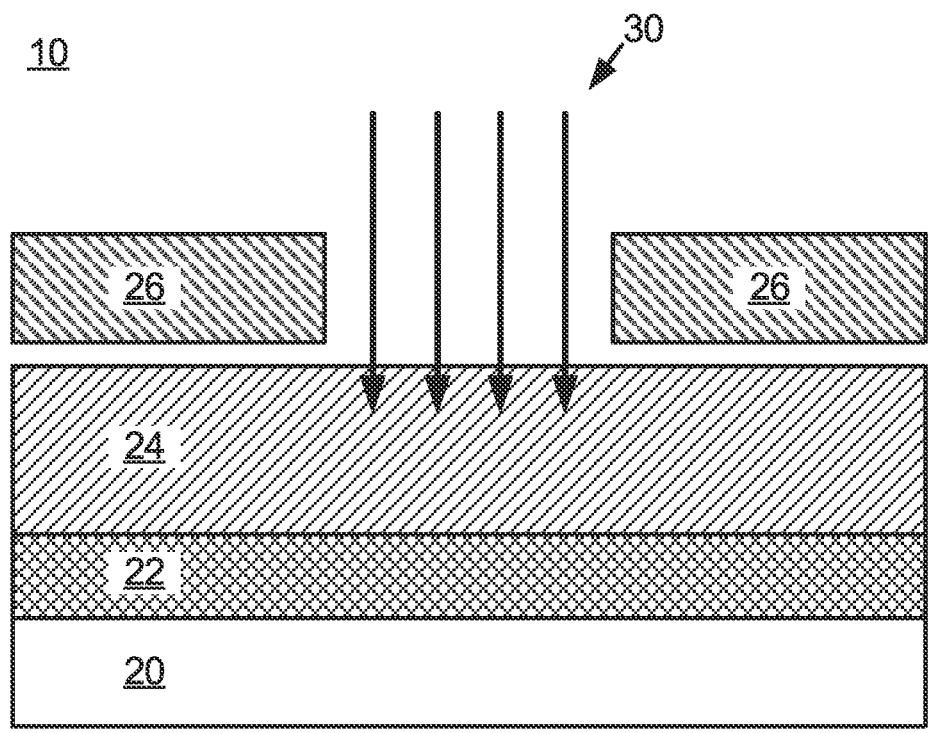
FIG. 7 is a cross-sectional view of the device of FIG. 6 showing a EUV lithography process being performed on the semiconductor device, in accordance with an embodiment of the present invention.

Referring to FIG. 7, the photoresist layer 24 is patterned by EUV lithography 30. According to aspects of an embodiment of the present invention, the photoresist layer 24 is patterned by EUV lithography 30 to form the corresponding patterning. The EUV lithography 30 uses light with a wavelength in the extreme ultraviolet range for extremely fine resolution patterning. Using the EUV lithographic 30 process, the pattern can be formed by removing material between the lithograph mask 26 according to a predetermined pattern. Using such a process, the photoresist layer 24 can be formed with pitch sizes from between about 20 nanometers (nm) and about 40 nm with the photoresist layer 24 width of, e.g., about 25 nm or less. The EUV lithography 30 delivers an EUV dosage to the photoresist layer 24 during the process. The size of the EUV dosage limits the speed a wafer can be processed and can limit the number of wafers per hour exposed on a EUV scanner performing the EUV lithographic 30 process. The graded hardmask 22 can reduce the EUV dosage range by about 5-20% compared to the EUV dosage needed for devices with non-graded hardmasks. The dosage improvement is dependent on material type and gradient composition of the graded hardmask 22. In one embodiment, the EUV dosage could be from about 25 mJ-100 mJ.

EUV light sources designed for lithography tools can have high average power (e.g., 100 W and above) at 2% bandwidth with a central wavelength of 13.5 nm. Such systems can employ a laser produced plasma (LPP) with a metal target (e.g., Sn) and a high-power laser (e.g., $CO_2$ with wavelength of 10.6 μm). Such a combination is well-suited for achieving high conversion efficiency (e.g., up to 4-5% in band) and high average power (e.g., about 100 W and above). In some embodiments to provide an EUV light source, a laser source is provided for initiating and/or maintaining a plasma. In this regard, the laser source may supply the energy required to rapidly heat the plasma-forming target material to a plasma, which, in turn, emits EUV light.

In one embodiment, the drive laser source may include, but is not limited to, one or more drive lasers. The number and type of lasers used in the drive laser source may depend on a number of factors including, but not limited to, the required power output of the individual lasers, the desired EUV light power output, and the efficiency of the EUV light generation process.

An Extreme Ultraviolet Lithography light source can have three primary components: a high-power $CO_2$ drive laser, a source plasma vessel, and a beam transport and focusing system (BTS). A high-energy laser (e.g., ~30 kilowatts) is transmitted to the vessel through the BTS where it is focused onto small droplets (e.g., ~25 microns in diameter) of highly purified liquid tin expelled from the droplet generator (DG).

The tin droplets are expelled from the DG at high speed (e.g., ~70 m/s) and frequency (e.g., 50,000 Hz) then vaporized to create laser-produced-plasma (LPP). EUV photons emitted from the plasma are collected by the mirror (designed with special coating to reflect a wavelength of light, e.g., 13.5 nm wavelength) and transmitted to the intermediate focus point where they enter the scanner and enable the patterning of very small (<10 nm) features on a silicon wafer surface.

In one embodiment, the one or more laser beam pulses provide the light source and may include a train of pulses with duration in the range, e.g., of between about 5 ns to about 50 ns. In another embodiment, the total average power of the beam outputted by the laser source may be in the range of about 1-10 kW. In another embodiment, the combination of multiple laser outputs may include triggering multiple lasers synchronously.

Figure 8:
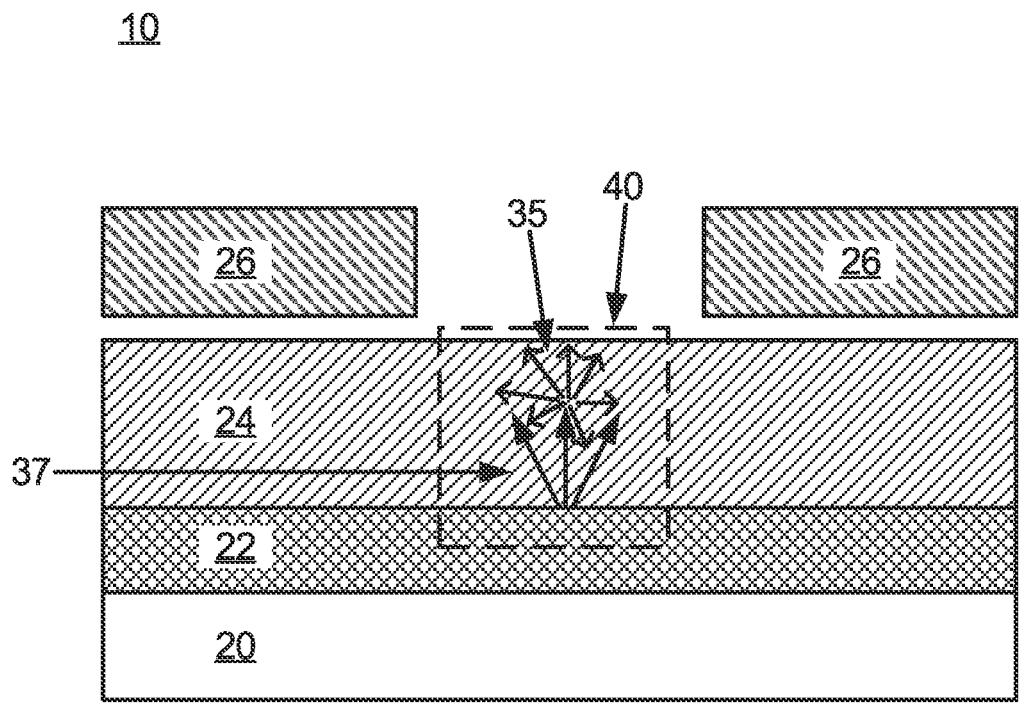
FIG. 8 is a cross-sectional view of the device of FIG. 7 showing the secondary electron generation in the photoresist layer, in accordance with an embodiment of the present invention.

Referring to FIG. 8, secondary electrons 35 generated from the photoresist layer 24 and hardmask electrons 37 develop the photoresist layer 24. EUV photons are higher in energy and ionize the photoresist layer 24, resulting in secondary electron 35 emission that enables photoacid generation. EUV photon absorption is limited in conventional photoresists and silicon based hardmasks, resulting in generation of fewer secondary electrons 35. Maximizing the quantum yield of EUV photons by increasing secondary electron 35 generation can improve exposure efficiency and minimize EUV dose requirements. The increased secondary electron 35 generation can reduce random or stochastics defects. The stochastics defects can be a yield limiter for conventional EUV patterning stacks. The graded hardmask 22 improves defectivity with scumming through improved second electron generation without compromising the lithographic process window. Patterning stacks can have pattern collapse due to high metal content poor adhesion on the top surface. This is addressed with the grade hardmask 22 by having a metal rich top surface which promotes adhesion to the resist interface due to its hydrophobicity and Van der Waals' bonding. The graded hardmask 22 eliminates the need for an extra adhesion promoter layer that can be vapor deposited. e.g., HMDS (hexamethyldisilazane), or a spin on organic material Eliminating the need for an adhesion promoter can reduce scumming, limit interfacial resist poisoning and also enable a more acid rich interface between the photoresist layer 24 and the graded hardmask 22. The graded hardmask 22 includes a gradient of embedded high-Z materials with enhanced EUV absorption cross-sections to improve hardmask electron 37 generation and yield at the interface of the photoresist layer 24 and the graded hardmask 22, increasing development of the photoresist layer 24. An exploded view 40 of the secondary electron generation is shown in FIG. 9.

Figure 9:
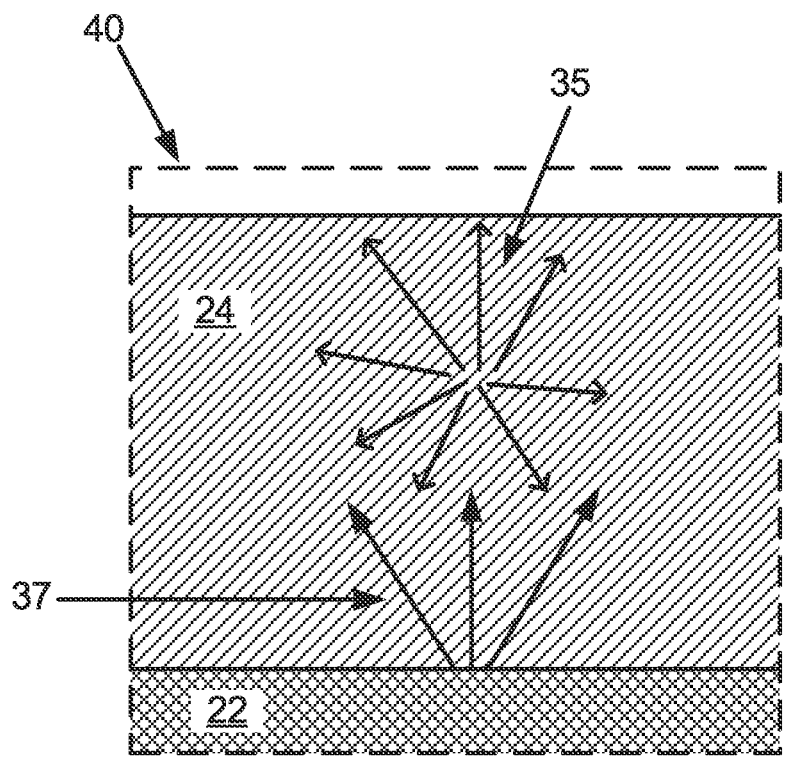
FIG. 9 is a blown-up view of the secondary electron generation in the photoresist layer, in accordance with an embodiment of the present invention.

Referring to FIG. 9, the exploded view 40 of the secondary electron generation in the photoresist layer 24. The EUV photons ionize the photoresist layer 24 and generate the secondary electron 35 emission that enables photoacid generation (PAG). The PAGs in the photoresist layer 24 increase sensitivity to the EUV light and maximizing the quantum yield of EUV photons through acid catalyzed by a chemical functionality change. The graded hardmask 22 includes a gradient of embedded high-Z materials with enhanced EUV absorption cross-sections to improve hardmask electron 37 generation and electron yield at the interface of the photoresist layer 24 and the graded hardmask 22, increasing the chemical contrast and the subsequent development of the photoresist layer 24.

Figure 10:
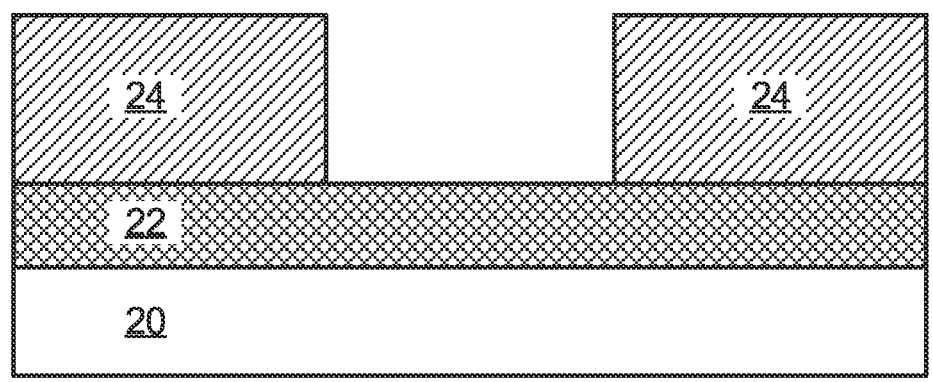
FIG. 10 is a cross-sectional view of the device of FIG. 8 showing the lithographic mask removed from the semiconductor device, in accordance with an embodiment of the present invention.

Referring to FIG. 10, the exposed photoresist layer 24 and the lithograph mask 26 are removed. Following the EUV exposure, the pattern is developed utilizing conventional resist developer, such as a chemical solvent. The developer leaves a hole in the photoresist layer 24 that corresponds to the opaque pattern of the lithograph mask 26. In positive tone photoresist development the exposed area, e.g., area exposed to EUV lithography, is made soluble in the developer. In negative tone photoresist development the exposed area, e.g., area exposed to EUV lithography, is made insoluble to the developer. The developer can include, for example, a tetramethylammonium hydroxide (TMAH) or a tetramethylammonium hydroxide (TMAH) like developer.

Figure 11:
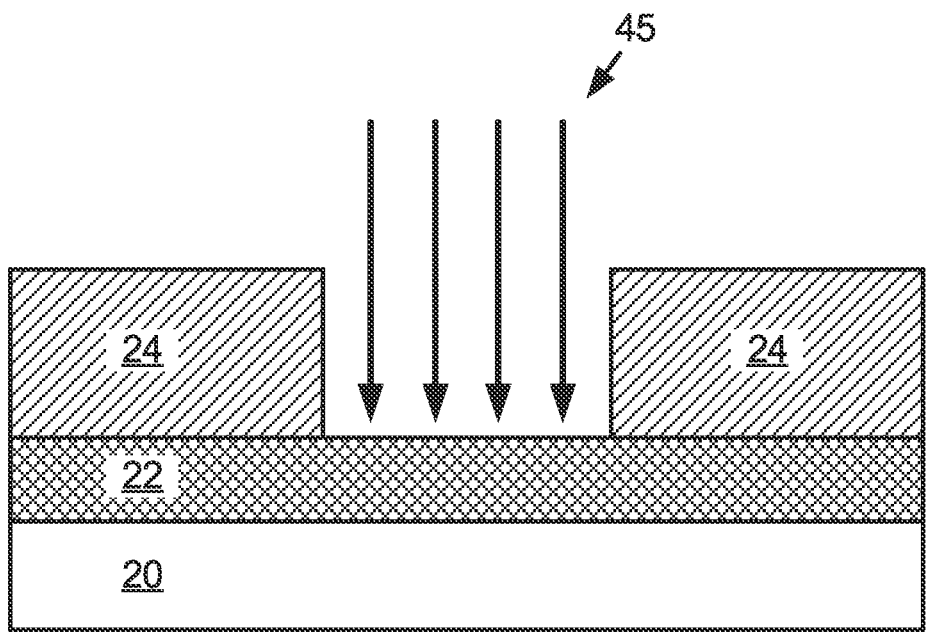
FIG. 11 is a cross-sectional view of the device of FIG. 10 showing the graded hardmask being etched on the semiconductor device, in accordance with an embodiment of the present invention.

Referring to FIG. 11, the graded hardmask 22 is etched. Any suitable etch process 40 may be employed that is selective to the graded hardmask 22. In one embodiment, the graded hardmask 22 is etched back with a reactive ion etch chemistry (RIE).

Figure 12:
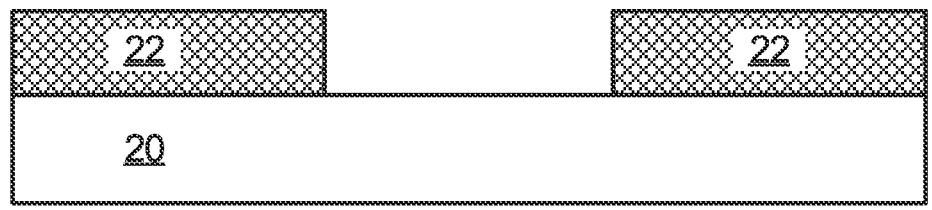
FIG. 12 is a cross-sectional view of the device of FIG. 11 showing the photoresist layer removed from the semiconductor device, in accordance with an embodiment of the present invention.

Referring to FIG. 12, the photoresist layer 24 is removed. Any suitable process may be employed that is selective to the photoresist layer 24. In one embodiment, the photoresist layer 24 is removed with an alkaline solution.

Referring to FIG. 13, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1310, a graded hardmask is formed, the graded hardmask including a first material and a second material with extreme ultraviolet (EUV) absorption cross sections for absorption of EUV wavelengths, the second material configured to provide adhesion to photoresist materials. In block 1311, the graded hardmask includes the first material and gradients of the second material doped into the first material. In block 1315, the first material and the second material are vertically graded. In block 1316, adjust a percentage of the first material to the second material linearly across a thickness. In block 1317, the second material is selected from the group consisting of high-Z metals, metalloids, and halogens. In block 1318, the second material has a EUV absorptivity cross-section of at least 92 eV. In block 1320, a photoresist layer is deposited over the graded hardmask. In block 1330, the photoresist layer is patterned. In block 1340, the graded hardmask is etched. In block 1350, the photoresist layer is removed.

Referring to FIG. 14, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1410, a hardmask, including a first material and a second material with high extreme ultraviolet (EUV) absorption cross sections for absorption of EUV wavelengths, is graded by adjusting a percentage of the second material in the hardmask to include a highest percentage of the second material at a top surface of the hardmask. In block 1415, the first material and the second material are vertically graded. In block 1416, the second material is selected from the group consisting of high-Z metals, metalloids, and halogens. In block 1417, the second material has a EUV absorptivity cross-section of at least 92 eV. In block 1420, a photoresist layer is deposited over a top surface of the hardmask. In block 1430, the photoresist layer is patterned with a dosage extreme ultraviolet source to reduce scumming defectivity. In block 1432, portions of the photoresist layer are removed with a developer. In block 1440, the hardmask is etched. In block 1450, the photoresist layer is removed.

Referring to FIG. 15, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1510, a hardmask, including a first material and a second material with high extreme ultraviolet (EUV) absorption cross sections, is graded by adjusting a concentration of the second material in the hardmask by doping the first material with the second material. In block 1515, the first material is spun-on. In block 1516, the second material is selected from the group consisting of high-Z metals, metalloids, and halogens. In block 1517, the second material has a EUV absorptivity cross-section of at least 92 eV. In block 1520, a photoresist layer is deposited over the hardmask. In block 1530, the photoresist layer is patterned with a dosage extreme ultraviolet source to reduce scumming defectivity. In block 1532, a EUV dosage from about 25 mJ-100 mJ is utilized. In block 1540, the hardmask is etched. In block 1550, the photoresist layer is removed.

Having described preferred embodiments of a system and methods of graded hardmask interlayers for enhanced extreme ultraviolet performance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A method for semiconductor processing, comprising:
forming a graded hardmask in direct contact with a substrate, the graded hardmask including a first material and a tin-based second material with extreme ultraviolet (EUV) absorption cross sections for absorption of EUV wavelengths;
depositing a photoresist layer in direct contact with the graded hardmask;
patterning the photoresist layer;
etching the graded hardmask; and
removing the photoresist layer,
wherein tin gradient incrementally increases in a multi-stepped manner from bottom to top such that tin oxide is disposed at the bottom adjacent the substrate and increased concentration tin is disposed directly under the photoresist layer.

2. The method as recited in claim 1, wherein patterning includes patterning with EUV lithographic accuracy.

3. The method as recited in claim 1, wherein patterning includes removing portions of the photoresist layer with a developer.

4. The method as recited in claim 1, wherein patterning includes utilizing a dosage from an EUV source to reduce scumming defectivity.

5. The method as recited in claim 1, wherein the second material provides adhesion to photoresist materials.

6. The method as recited in claim 1, wherein quantum yield of EUV photons is maximized by increasing secondary electron generation to improve exposure efficiency and minimize EUV dose requirements.

7. The method as recited in claim 1, wherein the second material has an EUV absorptivity cross-section at 92 eV.

8. The method as recited in claim 1, wherein forming includes spinning-on the graded hardmask.

9. The method as recited in claim 1, wherein forming includes vacuum co-depositing the graded hardmask.

10. The method as recited in claim 1, wherein forming includes vertically grading the first material and the second material.

11. The method as recited in claim 10, wherein vertically grading includes adjusting a percentage of the first material to the second material linearly across a thickness.

12. A method for semiconductor processing, comprising:
forming a graded hardmask in direct contact with a substrate, including a first material and a tin-based second material with extreme ultraviolet (EUV) absorption cross sections for absorption of EUV wavelengths;
depositing a photoresist layer in direct contact with the top surface of the graded hardmask; and
patterning the photoresist layer with a dosage of an EUV source to reduce scumming defectivity,
wherein tin gradient incrementally increases in a multi-stepped manner from bottom to top such that tin oxide is disposed at the bottom adjacent the substrate and increased concentration tin is disposed directly under the photoresist layer.

13. The method as recited in claim 12, further comprising etching the hardmask.

14. The method as recited in claim 13, further comprising removing the photoresist layer.

15. The method as recited in claim 12, wherein quantum yield of EUV photons is maximized by increasing secondary electron generation to improve exposure efficiency and minimize EUV dose requirements.

16. The method as recited in claim 12, wherein the second material has an EUV absorptivity cross-section at 92 eV.

17. The method as recited in claim 12, wherein forming includes spinning-on the graded hardmask.

18. The method as recited in claim 12, wherein forming includes vacuum co-depositing the graded hardmask.

19. The method as recited in claim 12, wherein forming includes vertically grading the first material and the second material.

20. The method as recited in claim 19, wherein vertically grading includes adjusting a percentage of the first material to the second material linearly across a thickness.

* * * * *